United States Patent
Wang et al.

(10) Patent No.: US 6,440,805 B1
(45) Date of Patent: Aug. 27, 2002

(54) METHOD OF FORMING A SEMICONDUCTOR DEVICE WITH ISOLATION AND WELL REGIONS

(75) Inventors: Xiaodong Wang; Michael P. Woo; Craig S. Lage; Hong Tian, all of Austin, TX (US)

(73) Assignee: Mototrola, Inc., Schaumburg, IL (US)

(*) Notice: Subject to any disclaimer, the term of this patent is extended or adjusted under 35 U.S.C. 154(b) by 0 days.

(21) Appl. No.: 09/516,970

(22) Filed: Feb. 29, 2000

(51) Int. Cl.$^7$ .............................................. H01L 21/336

(52) U.S. Cl. ..................... 438/282; 438/420; 438/528

(58) Field of Search .............................. 438/282, 294, 438/305, 307, 407, 414, 420, 526, 528, 546, 549, 923

(56) References Cited

U.S. PATENT DOCUMENTS

| | | | |
|---|---|---|---|
| 5,286,666 A | 2/1994 | Katto et al. | 437/52 |
| 5,394,007 A | 2/1995 | Reuss et al. | 257/544 |
| 5,397,734 A | 3/1995 | Iguchi et al. | 437/70 |
| 5,455,437 A | 10/1995 | Komori et al. | 257/376 |
| 5,585,286 A * | 12/1996 | Aronowitz et al. | 438/528 |
| 5,668,755 A | 9/1997 | Hidaka | 365/182 |
| 5,780,907 A | 7/1998 | Ema et al. | 257/371 |
| 5,927,991 A | 7/1999 | Lee | 438/228 |
| 6,221,724 B1 * | 4/2001 | Yu et al. | 438/528 |
| 6,225,151 B1 * | 5/2001 | Gardner et al. | 438/407 |

FOREIGN PATENT DOCUMENTS

| | | | |
|---|---|---|---|
| EP | 0809302 A2 | 11/1997 | H01L/29/00 |
| WO | WO 86/02202 | 4/1986 | H01L/29/167 |

OTHER PUBLICATIONS

Tamohisa Wada et al., "A 500MHz Pipelined Burst SRAM with Improved SER Immunity", ISSCC99, 1999 IEEE International Solid State Cir. Conf., Session 11, Paper TA 11.4, pp. 196–197.
Craig Lage et al., "Soft Error Rate and Stored Charge Requirement in Advanced High–Density SRAMs", 1993 IEEE International Electron Device Mtg., pgs.
Tomohisa Wada et al., "A 500MHz Pipelined Burst SRAM with Improved SER Immunity", 1999 IEEE International Aolid–State Circuits Conference, pp. 196–197.
PCT Search Report, PCT/US 01/03115 (3 pgs.).

* cited by examiner

*Primary Examiner*—Chandra Chaudhari
(74) *Attorney, Agent, or Firm*—Robert A. Rodriguez; Joseph P. Lally

(57) ABSTRACT

A semiconductor device and its method of fabrication are disclosed. The method includes forming a first well region in a semiconductor substrate. The semiconductor substrate includes a first doped region below the first well region. The first well region and the first doped region are doped with a first type dopant and the first well region is electrically connected to the first doped region. An isolation region is formed between the first well region and the first doped region. The isolation region is electrically connected to a second well region. The isolation region and the second well region are doped with a second dopant type The second dopant type is opposite the first dopant type. In one embodiment, the first type dopant includes a p-type dopant, and the second type dopant includes an n-type dopant. The method may further include, forming a second doped region within the first well region and below the isolation region. A third doped region with the first type dopant may be formed over the isolation region. The method may further include forming a gate electrode over the semiconductor substrate, forming source/drain regions adjacent the gate electrode and forming a protective charge recombination region below the gate electrode and the source/drain regions.

10 Claims, 3 Drawing Sheets

METHOD OF FORMING A SEMICONDUCTOR DEVICE WITH ISOLATION AND WELL REGIONS

FIELD OF THE INVENTION

The present invention is related to the field of semiconductor fabrication and more particularly to a method and structure for reducing soft error rate in a semiconductor circuit.

RELATED ART

Semiconductor memory products are susceptible to a data loss phenomenon generally referred to as soft errors. Soft errors in semiconductor products may result from environmental radiation that alters the amount of charge stored on a semiconductor circuit such as a static random access memory (SRAM) or dynamic random access memory (DRAM) device. In many integrated circuits including SRAMs and DRAMs, the logical state of the integrated circuit is dependent upon an extremely small amount of stored charge. Environmental particle radiation originating from a variety of sources can alter the amount of charge stored in a cell or element of a memory device. It will be appreciated that the soft error rate varies with the amount of charge stored on a storage node of the memory device. As the power supply voltage and the cell size of memory devices decrease, the amount of charge stored decreases accordingly thereby increasing the probability of a soft error event. Therefore, it would be highly desirable to implement a process and device that could substantially reduce the soft error rate without significantly increasing the cost or complexity of the process.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
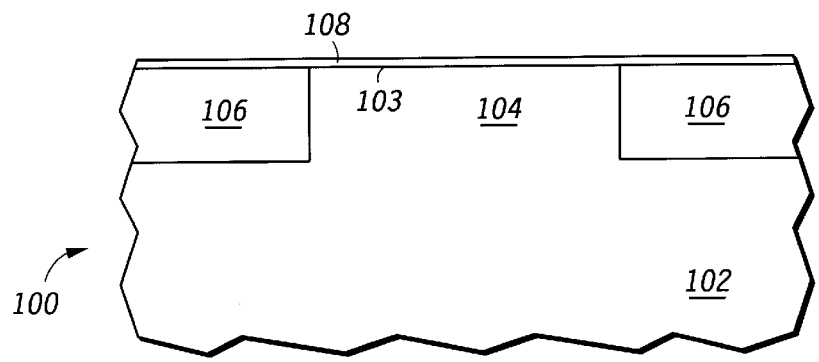
FIG. 1 is a partial cross sectional view of a semiconductor substrate.

Turning now to the drawings, FIG. 1 one depicts a partial cross-sectional view of a semiconductor wafer 100. Preferably, semiconductor substrate 100 comprises a single crystal wafer of silicon or other suitable semiconductor material.

In the depicted embodiment, wafer 100 includes a first doped region in the form of a p-type substrate 102 into which field structures 106 have been formed on either side of a first well region (p-well region) 104 of substrate 102. Field structures 106 may comprise shallow trench isolation (STI) structures, local oxidation of silicon (LOCOS) structures, or any other suitable isolation structure familiar to those knowledgeable in the field of semiconductor fabrication. Although the depicted embodiment of semiconductor substrate 102 depicts a p-type substrate, it will be further appreciated that the present invention is suitable for use in a process that uses a starting material comprising an n-type substrate.

FIG. 1 further shows a sacrificial oxide layer 108 formed over an upper surface 103 of semiconductor substrate 102. Sacrificial oxide layer 108 is formed to minimize damage to semiconductor substrate 102 during subsequent processing. Sacrificial oxide layer 108 may be fabricated using a thermal oxidation step or a low temperature deposition step.

Figure 2:
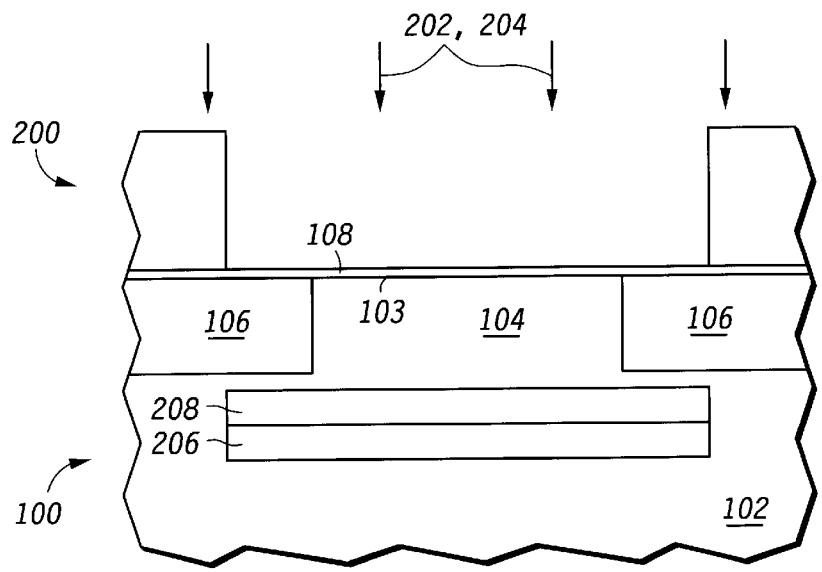
FIG. 2 is a processing step subsequent to the processing step of FIG. 1 in which an n-type isolation layer is introduced into a p-type substrate in selective regions of the semiconductor substrate.

Turning now to FIG. 2, further processing of the wafer 100 of FIG. 1 is depicted. In the depicted embodiment, an n-type impurity distribution (isolation region) 206 is introduced into wafer 100 between p-well region 104 and semiconductor substrate 102 with a first implant 202. In the preferred embodiment, first implant 202 is a phosphorus implant carried out at an energy in the range of approximately 500–1000 KeV with a dose of approximately 1E13 to 10E13 atoms/cm$^2$ to produce a peak impurity concentration in the range of approximately 1E17 to 1E19 atoms/cm$^3$. The first implant 202 is suitable for forming isolation region 206 well below the upper surface (primary surface) 103 of semiconductor substrate 102. The n-type isolation region 206, as contemplated in the present invention, will serve to locally isolate p-type substrate region 102 from p-well region 104. Isolation of the p-type substrate 102 from p-well region 104 beneficially reduces soft error rate by providing an electrical barrier that prevents electron-hole pairs generated in substrate 102 by environmental radiation (or generated by any other mechanism) from interacting with transistors subsequently formed in p-well region 104 of wafer 100.

As depicted in FIG. 2, a second implant indicated by reference numeral 204 is performed to form a p-type impurity layer 208 in close proximity to n-type impurity layer 206. In a preferred embodiment, the second implant 204 is carried out with a boron implant using an energy in the range of approximately 100–400 KeV with an implant dose in the range of approximately 1E13 to 10E13 atoms/cm$^2$. Still more preferably, the second implant 204 utilizes an implant energy of 200 KeV and an implant dose of 3.2E13 atoms/cm$^2$. The first and second implants 202 and 204 are preferably carried out following the formation of an implant mask indicated by reference numeral 200 on sacrificial oxide layer 108. The implant mask 200 is formed with conventional photolithography processing steps and prevents implant 202 and 204 from penetrating regions of substrate 102 below isolation (field) regions 106 while simultaneously enabling impurity distributions 206 and 208 to form under p-well region 104 of wafer 100. In embodiments of the present invention in which the wafer 100 is utilized to fabricate memory devices such as SRAMs and DRAMs, implant mask 200 may further prevent first and second implants 202 and 204 from forming impurity distributions in peripheral portions of the memory devices while enabling impurity distributions 206 and 208 to form in the memory array portions of wafer 100. Although the depicted embodiment indicates a p-type substrate 102 and the described impurity types for first and second implants 202 and 204, it will be appreciated that substrate 102 may comprise an n-type substrate while the dopant type of first and second implants 202 and 204 may be reversed such that the first impurity distribution 206 is a p-type impurity distribution while the second purity distribution is an n-type impurity distribution. In addition, type dopant as used in this specification can be extended to include other dopants from a same family of dopants (i.e. Group III type dopants or Group V type dopants) in the Periodic Table of the Elements.

Following the formation of isolation region 206, implant mask 200 is removed from wafer 100 and wafer 100 is thermally processed (annealed) to re-crystallize semiconductor substrate 102 and to activate first and second impurity distributions 206 and 208. In the preferred embodiment, the thermal treatment to which wafer 100 is subjected comprises a rapid thermal anneal process in which semiconductor substrate 102 is heated to a temperature in the range of approximately 900° to 1100° C. for a duration in the range of approximately 5 to 60 seconds. The short duration of the rapid thermal anneal in the preferred embodiment of the heat treatment step is sufficient to activate first and second impurity distributions 206 and 208 while preventing substantial redistribution of the impurity distributions. In an alternative embodiment, the heat treatment may comprise a conventional furnace anneal. In still another embodiment, the anneal can be delayed until after the formation of n-well regions 404 as described below in reference to FIG. 4. This embodiment beneficially reduces the total number of anneal cycles in the process.

Figure 3:
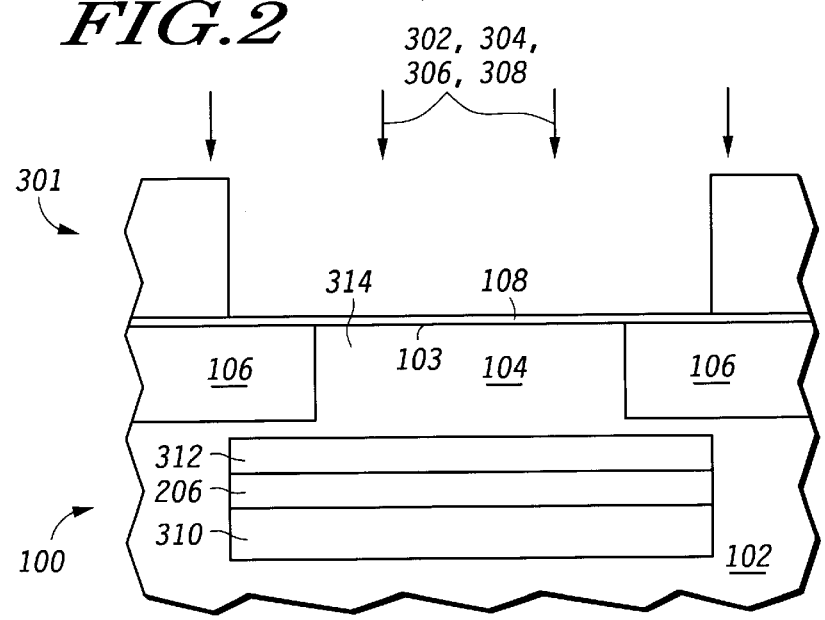
FIG. 3 is a partial cross sectional view subsequent to the processing step of FIG. 2 in which a second p-well impurity is implanted into the semiconductor substrate.

Turning now to FIG. 3, a second mask 301 is formed on sacrificial oxide 108 of wafer 100. Second mask layer 301 exposes substantially the same portions of the wafer 100 in the array as the first mask 200 exposed in the process step described with respect to FIG. 2. In addition, second mask 301 exposes p-well regions (not shown) in peripheral portions (i.e., non-array regions) of the device. Following the formation of second mask 301, a set of implants indicated by referenced numerals 302, 304, 306, and 308 are performed in one embodiment of the invention to introduce various p-type impurity distributions into substrate 102 and p-well region 104. In one embodiment, a third implant 302 is performed to introduce a second p-type impurity distribution (doped region) indicated by referenced numeral 310 into p-type substrate 102. In the preferred embodiment, the second p-type impurity distribution 310 is achieved with an implant step in which the depth of second p-type distribution 310 is greater than the depth of n-type impurity distribution 206 and in which the peak concentration of the impurity distribution 310 is in the range of approximately 1E17 to 1E19 atoms/cm$^3$. The p-type impurity distribution 310 creates a distribution peak below the peak of impurity distribution 206 to further improve the electrical barrier characteristics of the p-n junction formed between n-type isolation region 206 and p-type substrate 102. A fourth implant 304 as indicated in FIG. 3 produces a third impurity distribution (doped region) 312 that, combined with first impurity distribution 208 of FIG. 2, results in a p-type impurity distribution with a peak concentration at a depth below upper surface 103 of substrate 102 that is less than the depth of isolation region distribution 206 (i.e. third impurity distribution 312 is above isolation regions 206). In the preferred embodiment, fourth implant step 304 is a boron implant using an implant energy in the range of approximately 150–250 KeV. In the preferred embodiment, the implant energy used for the fourth implant step 304 is approximately equal to the implant energy used for second implant step 204 as indicated in FIG. 2. Using the same implant energy for implant step 204 and implant step 304, results in an impurity distribution 312 with a peak impurity concentration located above the peak impurity concentration of impurity distribution 206 and is preferably in the range of approximately 1E17 to 1E19 atoms/cm$^3$. In the preferred embodiment, the peak impurity concentration of the impurity distribution resulting from second implant step 204 and third implant step 304 is in the range of approximately 1E17–1E19 atoms/cm$^3$. Still more preferably, the peak impurity concentration is approximately 1E18 atoms/cm$^3$. Fifth and sixth implant steps 306 and 308 are suitably accomplished with a relatively low energy implant of a p-type impurity distribution to produce a p-well impurity distribution 314 in p-well region 104 of wafer 100. In the preferred embodiment, the fifth implant 306 is a boron implant using an energy in the range of approximately 50–150 KeV and an implant dose in the range of approximately 2E12–3E12 atoms/cm$^2$. Still more preferably, fifth implant 306 uses an implant energy of approximately 100 KeV and a dose of approximately 2.5E12 atoms/cm$^2$. In the depicted embodiment, the p-well impurity distribution 314 is further formed by a sixth implant 308 that comprises a boron implant with an energy in the range of approximately 25–75 KeV and an implant dose of approximately 2E12–3E12 atoms/cm$^2$. In the preferred embodiment, the energy for sixth implant 308 is approximately 50 KeV while the implant dose is approximately 2.5E12 atoms/cm$^2$. In this embodiment, the combination of fifth and sixth implants 306 and 308 produce a relatively uniform p-well impurity distribution 314 that extends from an upper surface 103 of wafer 100 to a depth of approximately 250 nanometers.

Figure 4:
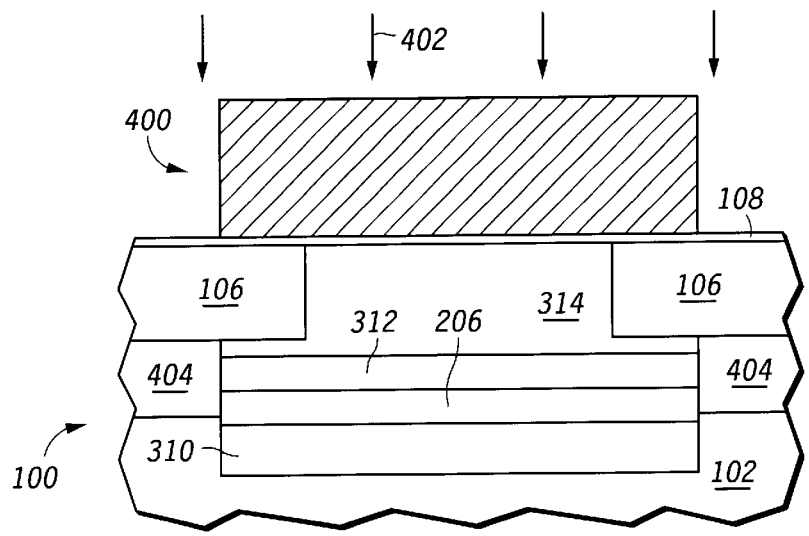
FIG. 4 is a cross sectional view subsequent to the processing step of FIG. 3 in which an n-well impurity is introduced into regions of the semiconductor substrate other than the regions into which the above mentioned impurities are introduced.

Turning now to FIG. 4, a third masking step is used to produce a third mask 400 on sacrificial oxide layer 108 of wafer 100. The third mask 400 defines regions of substrate 102 into which an n-type impurity distribution is introduced to form n-well regions 404 of wafer 100. In the preferred embodiment, the various portions of the n-well regions 404 are electrically connected to each other via the isolation region 206. The combination of the n-well regions 404 on either side of second impurity distribution 206 locally isolates each p-well region 104 from p-substrate 102. The local isolation of p-well 104 from p-substrate 102 provides an effective barrier that substantially prevents electron-hole pairs generated in substrate 102 by environmental radiation from penetrating p-well region 104 and affecting the operation of devices formed therein. Although p-well regions 104 are locally isolated from p-substrate regions 102 in the array portions of wafer 100, each p-well region 104 is electrically connected to p-substrate region 102 through a p-well contact (not shown in FIG. 4).

Figure 8:
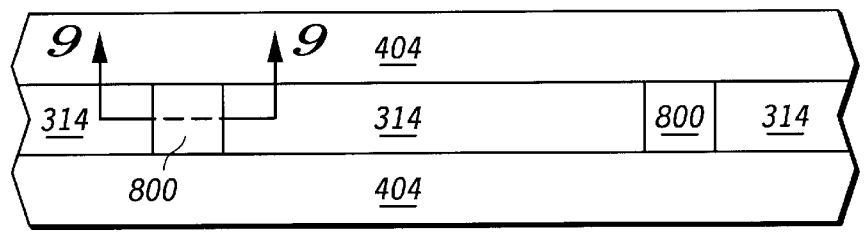
FIG. 8 is a partial top view of the semiconductor wafer.

Turning to FIG. 8, a top plan view of a portion of wafer 100 is depicted indicating a p-well contact region 800 formed between n-well regions 404 and p-well impurity distributions 314. In all regions of wafer 100 other than contact regions 800, the n-type impurity region 206 extends below p-well impurity distribution 314. In regions 800, however, the second type impurity distribution 206 is prevented from entering wafer 100. In the absence of an n-type impurity distribution 206, it will be appreciated that p-well impurity distribution 314 is electrically connected to p-type substrate 102. This electrical connection between p-well region 314 and p-type substrate 102 in the present invention beneficially reduces the series resistance of each p-well impurity distribution 314 and provides a mechanism for electrically grounding each p-well impurity distribution 314.

Figure 9:
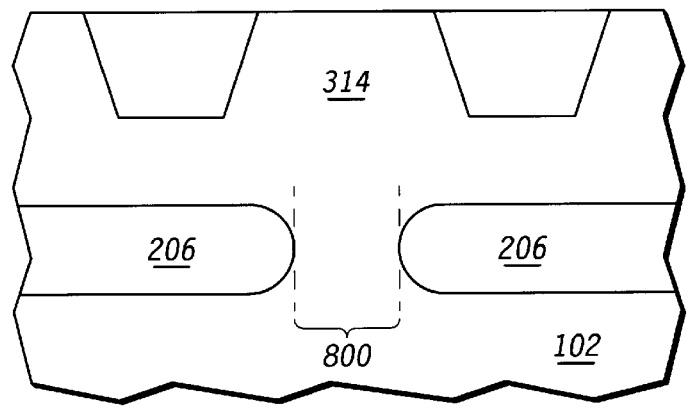
FIG. 9 is a partial cross sectional view of the semiconductor wafer of FIG. 8.

Referring to the partial cross-sectional view of FIG. 9, is seen that the region 800 defines a window in which the n-type impurity distribution 206 is prevented from forming thereby enabling p-well impurity distribution 314 to electrically contact p-type substrate 102. In the preferred embodiment, the region 800 is defined by the first mask 200 depicted in FIG. 2. In other words, first mask 200 includes regions 800 in which the photoresist prevents first and second implants 202 and 204 from entering the underlying substrate.

Returning now to FIG. 4, in addition to forming the n-well regions on either side of n-type impurity distribution 206, implant 402 forms the n-well region for the p-type transistors both in the array and in the peripheral portions of the semiconductor wafer 100. In another embodiment, an additional photo step (not indicated) may be utilized to provide a separate implant step to control the n-well formation in the peripheral portions of the device 100.

Figure 5:
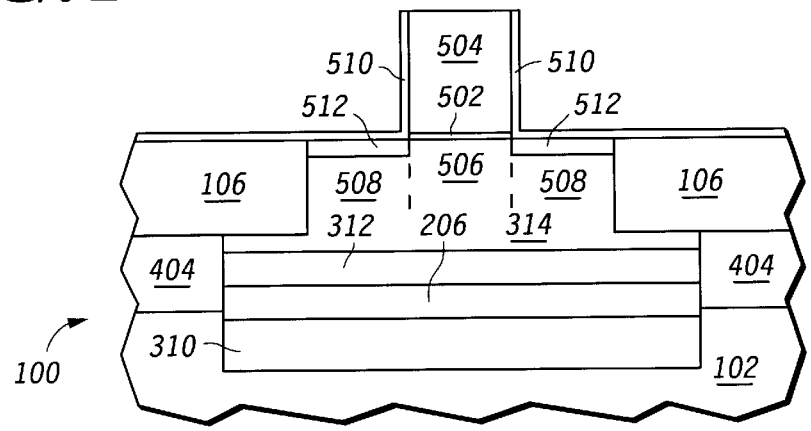
FIG. 5 is a processing step subsequent to FIG. 4 in which a transistor including a gate structure and source/drain regions are fabricated on the semiconductor substrate.

Turning now to FIG. 5, a partial cross sectional view of wafer 100 illustrating further processing after implant step 402 as depicted in FIG. 4 is depicted. After implant 402 in FIG. 4, the mask layer 400 and the sacrificial oxide layer 108 are removed from wafer 100. Thereafter, a thermal oxidation step is performed to form a gate oxide 502 on the upper surface of wafer 100. Typically, the oxide thickness of gate oxide 502 is in the range of approximately 20–75 angstroms. After the formation of gate oxide 502, a gate structure 504 is formed on gate oxide 502. The gate structure 504 defines the boundaries of a channel region 506 from source/drain regions 508 in the p-well region 104 of wafer 100. In one embodiment, the gate structure 504 is comprised of polysilicon. Alternatively, the gate structure 504 can be formed using metal-containing materials, such as refractory metals and their alloys. After the deposition layer of the layer used to form the gate structure 504, a masking and etch step are performed to pattern the gate structure 504. After the formation of gate structure 504, a re-oxidation step is performed to form a narrow region of dielectric material (indicated by referenced numerals 510) on the outer regions of gate structure 504. Following the re-oxidation of gate structure 504, a source/drain extension implant is performed using gate structure 504 as an implant mask to form source/drain extension regions 512 on either side of channel region 506. In the preferred embodiment, the source/drain extension implant used to form source/drain extension regions 512 is accomplished with an n-type impurity implant such as phosphorus or arsenic. In one embodiment, a halo implant may be performed to introduce a relatively lightly doped p-type impurity distribution into the source/drain regions 508 in p-well region 104.

Figure 6:
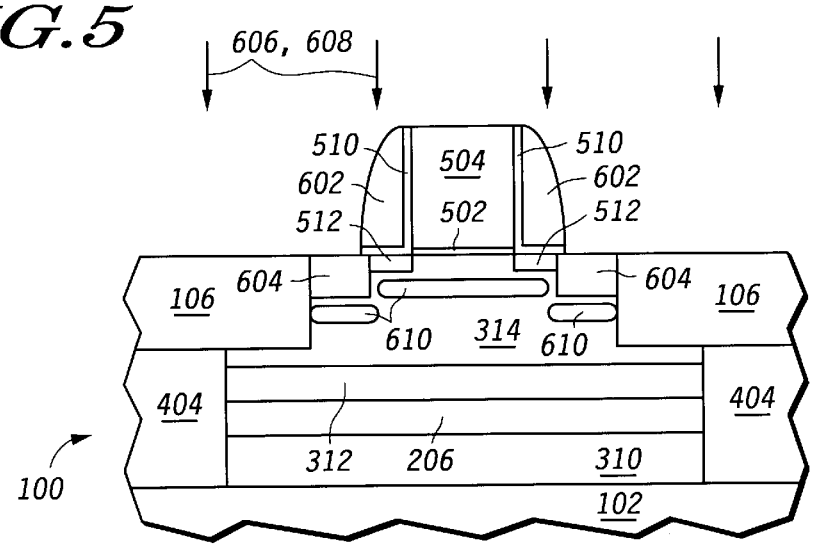
FIG. 6 is a processing step subsequent to FIG. 5 in which a protective charge collection layer is introduced into the semiconductor substrate.

Turning now to FIG. 6, spacers structures 602 are formed on the sidewalls of a gate structure 504. In one embodiment, the formation of spacer structures 602 is accomplished with chemical vapor deposition of silicon nitride followed by an anisotropic etch process. Following the formation of spacer structures 602, source/drain impurity distributions 604 are introduced into source/drain regions 508 of p-well regions 104 with a source/drain implant indicated in FIG. 6 by reference number 606. Preferably, source/drain implant 606 comprises an n-type implant using a dose sufficient to create a heavily doped source/drain region 604 (i.e., a source/drain region with a doping concentration in excess of approximately 1 E19 atoms/cm$^3$).

In accordance with one embodiment, the soft error rate can further be reduced by forming a protective charge collection layer 610. The charge collection layer 610 can be used in conjunction with embodiments of the present invention, or alternatively with conventional semiconductor device structures to reduce soft error rate. The protective charge collection layer 610 is introduced into p-well region 314 with a protective charge collection layer implant indicated by reference numeral 608. The protective charge collection layer 610 preferably comprises an impurity distribution in p-well region 104 that facilitates indirect recombination of electron-hole pairs generated by environmental radiation. In one embodiment, the protective charge collection layer (also referred to as protective charge recombination region) 610 includes a first portion below gate structure 504 and second portion below source/drain regions 512. In this embodiment, the depth of the first portion of protection charge collection layer 610 below upper surface 103 of wafer 100 is less than the depth of the second portion. In one embodiment, protective charge collection layer 610 is fabricated by implanting an impurity such as argon, silicon, germanium, nitrogen, oxygen, or other suitable implant species suitable for facilitating recombination. A suitable dose for the implant of protective charge collection layer 610 is in the range of approximately 1E12 to 1E15 atoms/cm$^2$. In accordance with one embodiment, the protective charge collection layer implant 608 utilizes an argon implant with a dose in the range of approximately 1E13 to 5E13 atoms/cm$^2$ and an energy in the range of approximately 200 to 800 KeV.

In accordance with one embodiment, rapid thermal anneals are performed after the formation of source/drain extension region 512 and after the formation of source/drain regions 604. In one specific embodiment, the rapid thermal anneal of source/drain extension regions 512 is accomplished with a rapid thermal anneal using a temperature approximately 950 degrees C. and the rapid thermal anneal of source/drain regions 604 is suitably accomplished with an anneal of approximately 1025 degrees C. The rapid thermal anneal of source/drain extension regions 512 and of source/drain impurity distributions 604 activates the corresponding impurity distributions and is preferably achieved with an anneal time that is short enough to prevent significant redistribution of p-well impurity distribution 314. In one embodiment, the protective charge collection layer implant 608 may be performed prior to the rapid thermal anneal of source/drain impurity distributions 604. In this embodiment, any lattice damage resulting from protective charge collection layer implant 608 may be annealed out by the rapid thermal anneal process. In another embodiment, the protective charge collection layer implant 608 may be performed following the rapid thermal anneal of source/drain regions 604 to prevent any significant redistribution of protective charge collection layer 610.

Figure 7:
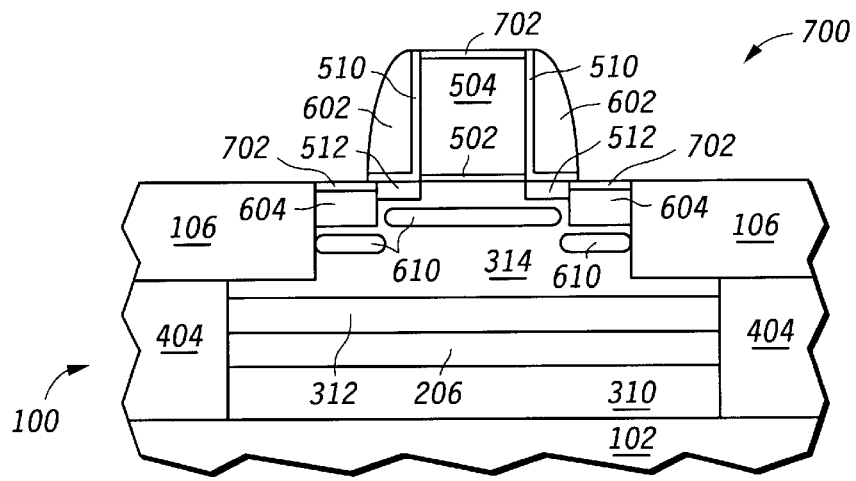
FIG. 7 is a processing step subsequent to FIG. 6 in which silicide regions are formed on the active and gate regions of the transistor of FIG. 5.

Turning now to FIG. 7, further processing of wafer 100 is illustrated. In FIG. 7, exposed portions of source/drain impurity distributions 604 and gate structure 504 are salicided by depositing a conductive material such as cobalt over the entire wafer and thereafter annealing at a relative low temperature (i.e. a temperature in the range of approximately 400 to 600 degrees C.). Following the silicide anneal, portions of the deposited metal in contact with a dielectric material such as oxide or nitride are removed using conventional etch processes. The portions of the conducive material in contact with silicon combine with the silicon during the anneal process to form a conductive material such as CoSi that is unaffected by the etch step. This is followed by another rapid thermal anneal step with a temperature of approximately 700–900 degrees C. Following, the silicide formation, the semiconductor fabrication process described in FIGS. 1–7 results in the formation of a device 700 with improved soft error immunity. By locally isolating the p-well region 104 from p-type substrate 102 of wafer 100, an electron-hole pair generated in substrate 102 is electrically isolated from the p-well region 104 and the source/drain regions of device 700. In addition, by introducing a protective charge collection layer 610 that facilitates indirect recombination of electron-hole pairs generated in p-well region 104, further reduction of soft error rates is achieved. The combination of the protective charge collection layer 610 and the isolating n-well/n-type impurity distribution structure provide a significant reduction in soft error rate over a conventionally formed semiconductor device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be considered as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:

forming a first well region in a semiconductor substrate, the semiconductor substrate having a first doped region below the first well region, wherein the first well region and the first doped region include dopants from a first-type dopant and wherein the first well region is electrically connected to the first doped region wherein electrical connectivity is maintained between the first well region and the first doped region after forming an isolation region between the first well region and the first doped region; and forming the isolation region between the first well region and the first doped region, the isolation region being electrically connected to a second well region, wherein the isolation region and the second well region include dopants from a second-type dopant, and wherein the second-type dopant is opposite the first-type dopant.

2. The method of claim 1, wherein the first-type dopant is further characterized as a p-type dopant, and wherein the second-type dopant is further characterized as an n-type dopant.

3. The method of claim 1, further comprising annealing the semiconductor substrate after forming the isolation region and prior to forming the first well region.

4. The method of claim 1, further comprising:

forming a second doped region between the isolation region and the first doped region, wherein the second doped region includes the first-type dopant, and wherein a concentration of the second doped region is in a range of approximately 1E17–1E19 atoms/cm$^3$; and forming a third doped region over the isolation region, wherein the third doped region includes the first-type dopant and wherein a concentration of the third doped region is in a range of approximately 1E17–1E19 atoms/cm$^3$.

5. The method of claim 1, wherein a dopant concentration of the isolation region is in a range of approximately 1E17–1E19 atoms/cm$^3$.

6. The method of claim 1, wherein a dopant concentration of the second well region is in a range of approximately 1E17–1E19 atoms/cm$^3$.

7. The method of claim 1 further comprising:

forming a gate electrode over the semiconductor substrate;

forming source/drain regions adjacent the gate electrode; and forming a protective charge recombination region below the gate electrode and the source/drain regions.

8. The method of claim 7, wherein the protective charge recombination region includes elements selected from a group consisting of argon, silicon, germanium, nitrogen, and oxygen.

9. The method of claim 7, wherein the protective charge recombination region is formed using an ion implantation process.

10. The method of claim 9, wherein the ion implantation process includes argon and has a dose in a range of approximately 1E12–1E15 atoms/cm$^2$.

* * * * *